(12) United States Patent
Giessmann et al.

(10) Patent No.: US 12,196,808 B2
(45) Date of Patent: Jan. 14, 2025

(54) MOTORIZED CHUCK STAGE CONTROLLING METHOD

(71) Applicant: MPI Corporation, Hsinchu County (TW)

(72) Inventors: Sebastian Giessmann, Hsinchu County (TW); Yu-Hsun Hsu, Hsinchu County (TW)

(73) Assignee: MPI CORPORATION, Hsinchu County (TW)

( * ) Notice: Subject to any disclaimer, the term of this patent is extended or adjusted under 35 U.S.C. 154(b) by 113 days.

(21) Appl. No.: 18/121,475

(22) Filed: Mar. 14, 2023

(65) Prior Publication Data

US 2023/0314505 A1 Oct. 5, 2023

(30) Foreign Application Priority Data

Mar. 29, 2022 (TW) .................................. 111112056

(51) Int. Cl.
*G01R 31/308* (2006.01)
*B23Q 3/16* (2006.01)
*G01R 31/28* (2006.01)

(52) U.S. Cl.
CPC ............ *G01R 31/308* (2013.01); *B23Q 3/16* (2013.01); *G01R 31/2831* (2013.01); *B23Q 2240/002* (2013.01)

(58) Field of Classification Search
None
See application file for complete search history.

(56) References Cited

U.S. PATENT DOCUMENTS

2021/0055344 A1* 2/2021 Chih .................. G01R 31/2891

* cited by examiner

*Primary Examiner* — Vincent Q Nguyen
(74) *Attorney, Agent, or Firm* — Birch, Stewart, Kolasch & Birch, LLP

(57) ABSTRACT

A motorized chuck stage controlling method adapted to a wafer probing device is provided. The wafer probing device includes a control rod and a motorized chuck stage. The control rod can be moved between an upper limit position and a lower limit position, and the motorized chuck stage is moved along a Z-axis direction in response to a movement of the control rod. One purpose of the motorized chuck stage controlling method is to allow the operator to define the highest position to which the motorized chuck stage can be moved in response to the movement of the control rod, thereby preventing the probe and the wafer from colliding with each other.

18 Claims, 10 Drawing Sheets

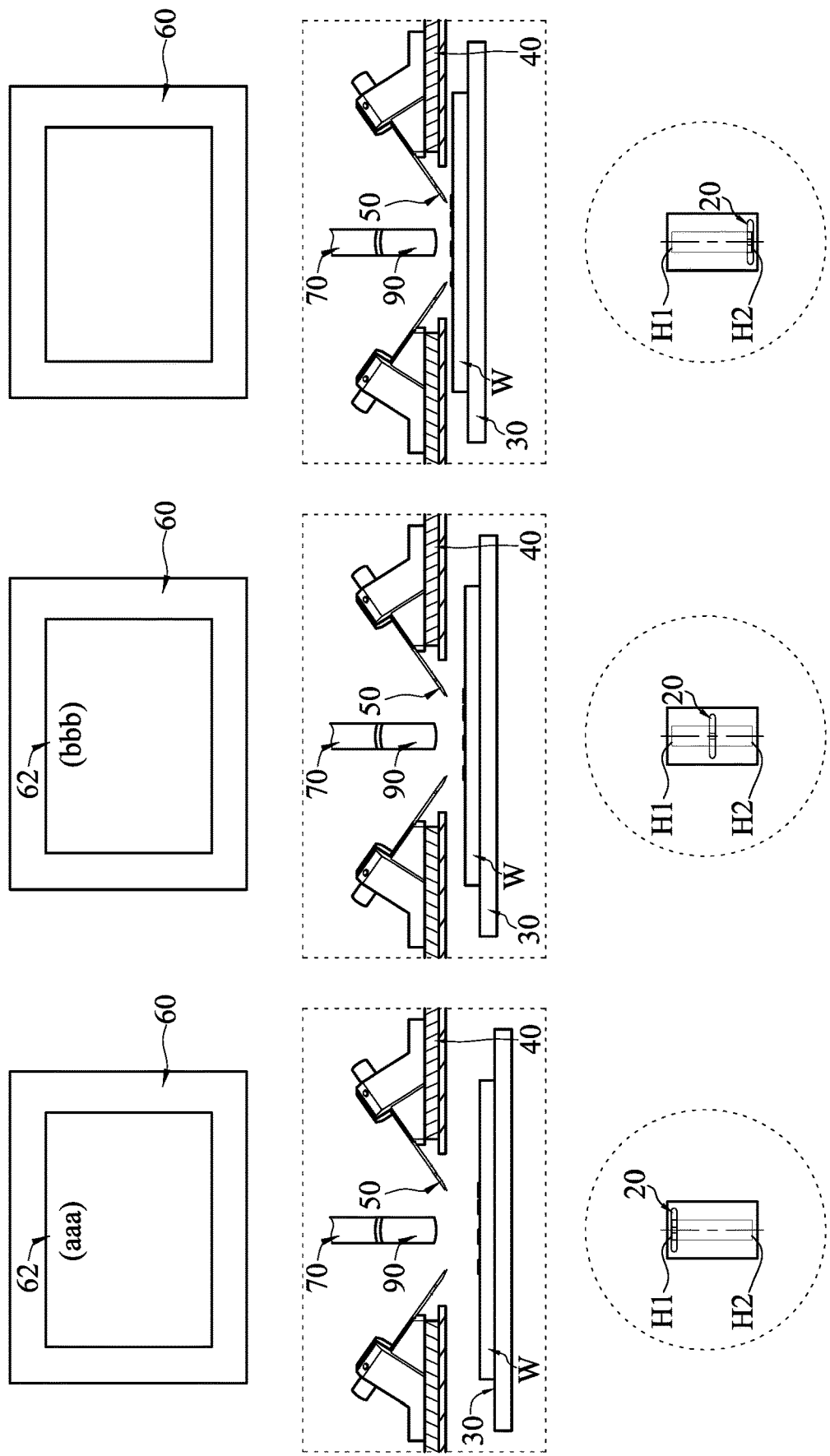

MOTORIZED CHUCK STAGE CONTROLLING METHOD

CROSS-REFERENCE TO RELATED APPLICATION

This non-provisional application claims priority under 35 U.S.C. § 119(a) to Patent Application No. 111112056 filed in Taiwan, R.O.C. on Mar. 29, 2022, the entire contents of which are hereby incorporated by reference.

BACKGROUND

Technical Field

The instant disclosure relates to a motorized chuck stage controlling method, especially to a motorized chuck stage controlling method adapted to a wafer probing device.

Related Art

Along with the developments of semiconductor technologies, applications of integrated circuits become popular. During the manufacturing process of the integrated circuit or after the integrated circuit are manufactured, in order to sort out defect products, a test signal is transmitted to the integrated circuit by a wafer testing device to test whether the integrated circuit works properly, so that the defect-free rate can be controlled. A wafer testing method known to the inventor is referred to as the wafer probing method. In the wafer probing method, the test signal is transmitted to the device under test (DUT) by the wafer probing device through the probe, and then the test result is received by the probe for subsequent analysis.

SUMMARY

A wafer probing device known to the inventor general includes a motorized chuck stage, a probe platform, a plurality of probes, and an image-capturing module. The motorized chuck stage is adapted to support a wafer, and the motorized chuck stage is capable of moving along the X-axis direction, the Y-axis direction, and the Z-axis direction so as to move the wafer to a desired position. The probe platform is above the motorized chuck stage, and the probes are fixed on the probe platform. In a wafer probing device known to the inventor, the image-capturing module is disposed above the motorized chuck stage to focus on the position under test on the wafer surface from a vertical direction, so that the image-capturing module can determine whether the tip of the probe contacts the soldering pad on the wafer. Furthermore, in another wafer probing device known to the inventor, the image-capturing module is at a side portion of the motorized chuck stage, and the image-capturing module is adapted to focus on the tip of the probe and the position under test on the wafer surface, so that the image-capturing module can determine whether the tip of the probe is going to contact the soldering pad on the wafer.

In practice, when an operator tries to control the motorized chuck stage to be moved upwardly, the operator can observe the distance between the tip of the probe and the soldering pad of the wafer through the image-capturing module in real-time. Nevertheless, when the operator performs an improper operation or when the control rod is collided so as to cause the motorized chuck stage to be moved upwardly excessively, the probe collides the wafer surface which thus cause the damage of the probe or the wafer; such improper operation condition is often referred to as the "probe-colliding issue."

In view of this, according to one embodiment of the instant disclosure, a motorized chuck stage controlling method adapted to a wafer probing device is provided. The wafer probing device comprises a control rod and a motorized chuck stage. The control rod is movable between an upper limit position and a lower limit position, and the motorized chuck stage is moved along a Z-axis direction in response to a movement of the control rod. The motorized chuck stage controlling method comprises: under a first operation state, controlling the motorized chuck stage to be at a first top position when the control rod is at the lower limit position, controlling the motorized chuck stage to be at a first bottom position when the control rod is at the upper limit position, and controlling the motorized chuck stage to be moved between the first top position and the first bottom position correspondingly when the control rod is moved between the lower limit position and the upper limit position. The motorized chuck stage controlling method further comprises detecting whether a setting command is received, and when the setting command is received, switching from the first operate state to a setting state and executing following steps: controlling the motorized chuck stage to stop moving in response to a movement of the control rod; detecting a current control rod position of the control rod and a current motorized chuck stage position of the motorized chuck stage; and detecting whether the control rod is already moved from the current control rod position to the lower limit position and setting the current motorized chuck stage position as a second top position of the motorized chuck stage when the control rod is already moved from the current control rod position to the lower limit position. The motorized chuck stage controlling method further comprises switching from the setting state to a second operation state, and under the second operation state, controlling the motorized chuck stage to be at the second top position when the control rod is at the lower limit position.

According to one embodiment of the instant disclosure, a motorized chuck stage controlling method adapted to a wafer probing device is provided. The wafer probing device comprises a control rod and a motorized chuck stage. The control rod is movable between an upper limit position and a lower limit position, and the motorized chuck stage is moved along a Z-axis direction in response to a movement of the control rod. The motorized chuck stage controlling method comprises: under a first operation state, controlling the motorized chuck stage to be at a first top position when the control rod is at the lower limit position, controlling the motorized chuck stage to be at a first bottom position when the control rod is at the upper limit position, and controlling the motorized chuck stage to be moved between the first top position and the first bottom position correspondingly when the control rod is moved between the lower limit position and the upper limit position. The motorized chuck stage controlling method further comprises detecting whether a setting command is received, and when the setting command is received, switching from the first operation state to a setting state and executing the following steps: controlling the motorized chuck stage to stop moving in response to a movement of the control rod; detecting a current control rod position of the control rod and a current motorized chuck stage position of the motorized chuck stage; calculating an offset distance of a current motorized chuck stage position of the motorized chuck stage with respect to the first top position; and controlling the motorized chuck stage to be moved downwardly by the offset distance from the current motorized chuck stage position so as to arrive at an intermediate position. The motorized chuck stage controlling method further comprises switching from the setting state to a second operation state, wherein under the second operation state, the motorized chuck stage is controlled to be moved upwardly by the offset distance from the intermediate position correspondingly when the control rod is moved downwardly from the current control rod position to the lower limit position.

BRIEF DESCRIPTION OF THE DRAWINGS

The disclosure will become more fully understood from the detailed description given herein below for illustration only, and thus not limitative of the disclosure, wherein:

FIG. 10A to FIG. 10C illustrate schematic views showing how the motorized chuck stage is moved corresponding to the movement of the control rod and how the display displays the distance information of the motorized chuck stage.

DETAILED DESCRIPTION

Figure 1:
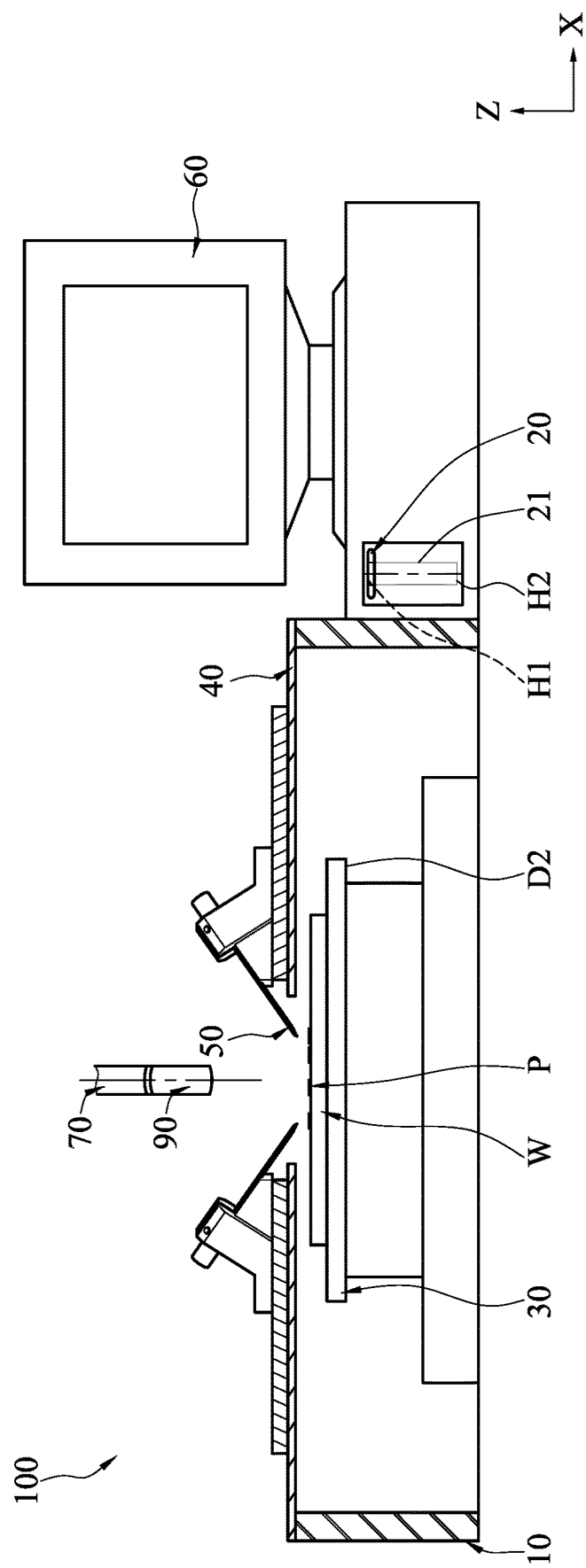
FIG. 1 illustrates a schematic view (1) of a wafer probing device adapted to implement a motorized chuck stage controlling method according some exemplary embodiments of the instant disclosure.
Figure 2:
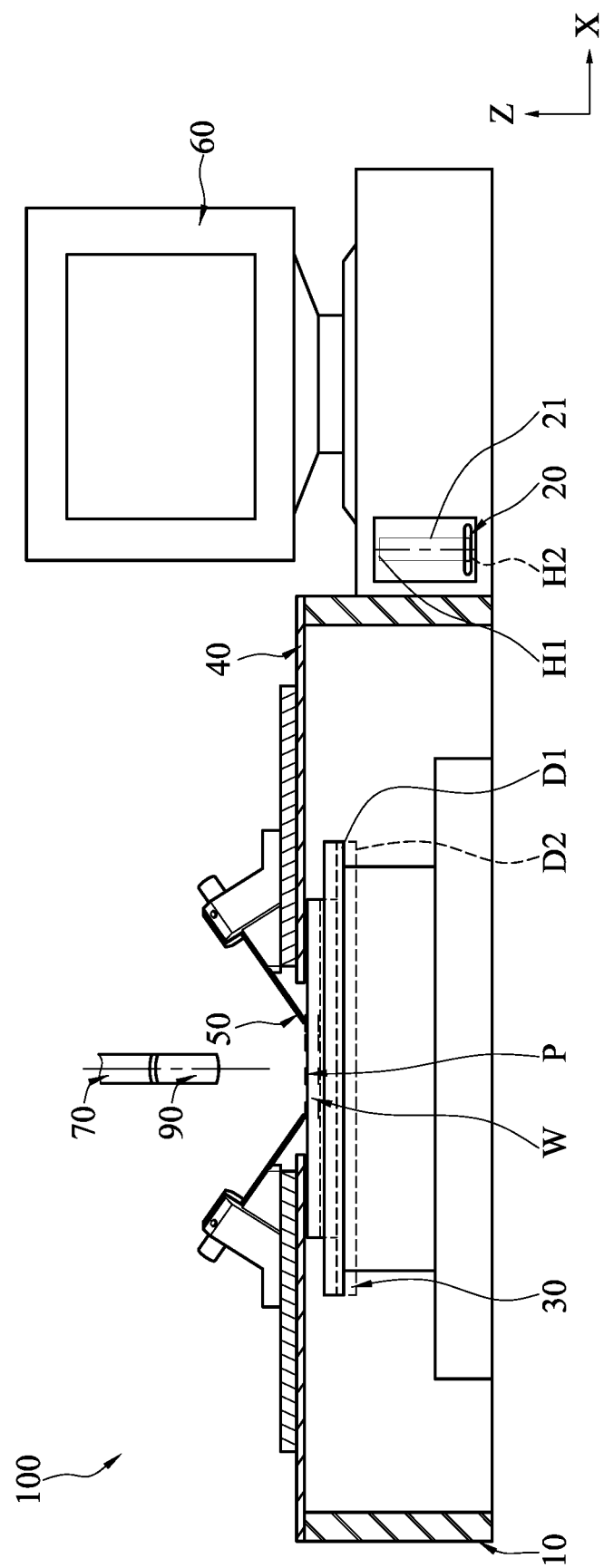
FIG. 2 illustrates a schematic view (2) of the wafer probing device adapted to implement the motorized chuck stage controlling method according some exemplary embodiments of the instant disclosure.
Figure 3:
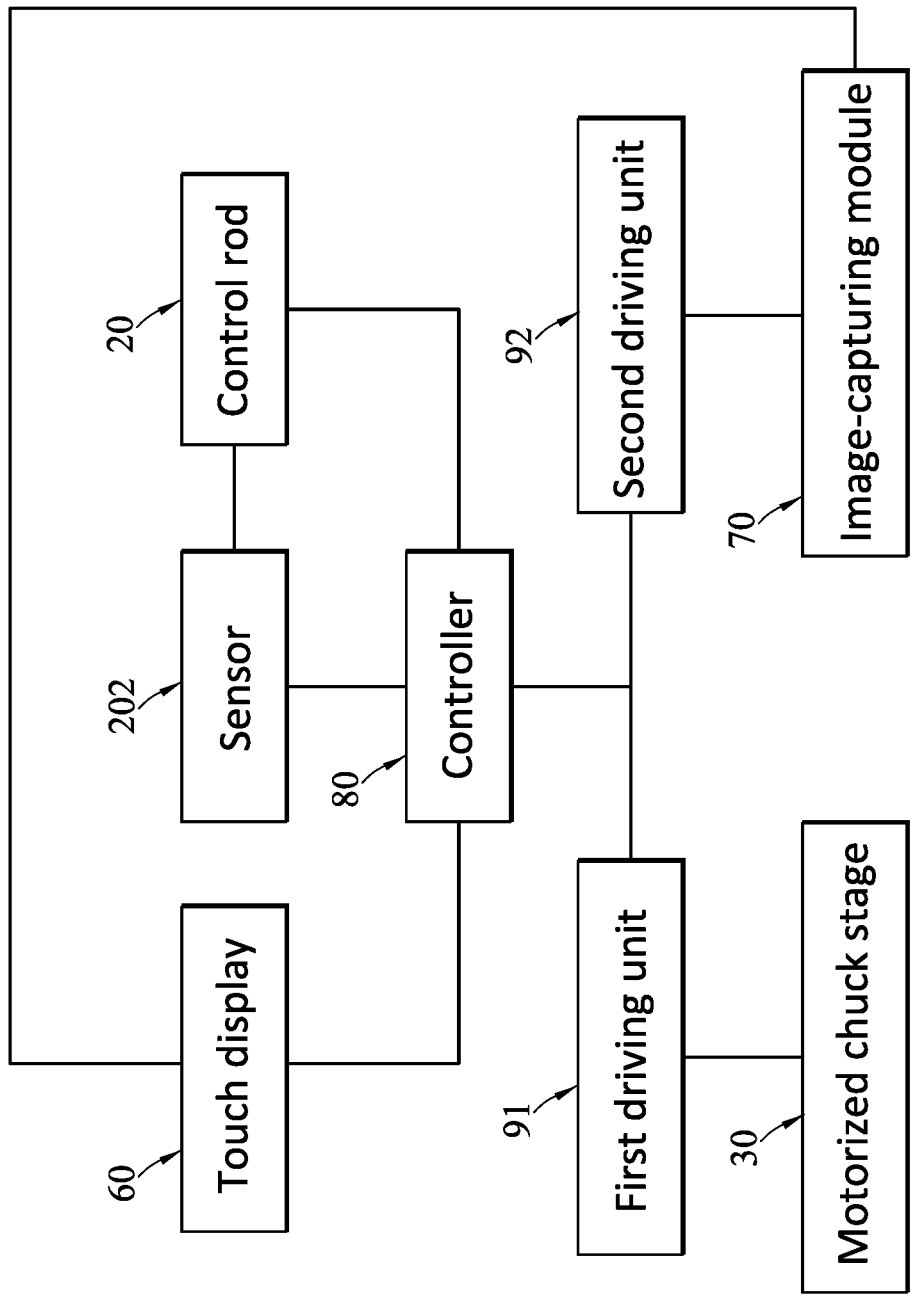
FIG. 3 illustrates a schematic module view of the wafer probing device adapted to implement the motorized chuck stage controlling method according to some exemplary embodiments of the instant disclosure.

Please refer to FIG. 1 to FIG. 3. FIG. 1, FIG. 2, and FIG. 3 respectively illustrate a schematic view (1), a schematic view (2), and a module view of a wafer probing device adapted to implement a motorized chuck stage controlling method according some exemplary embodiments of the instant disclosure. The wafer probing device 100 is adapted to detect the electrical condition of a wafer W. The wafer probing device 100 comprises a chassis 10, a control rod 20, a motorized chuck stage 30, a probe platform 40, a probe 50, a display 60, an image-capturing module 70, a controller 80, and a sensor 202. The details of the wafer probing device 100 can be further referred to Taiwan patent publication number 201929115 (U.S.A. counter publication No. US2019187206A1), and the entire contents of which are hereby incorporated by reference.

As shown in FIG. 1 and FIG. 2, the control rod 20 protrudes out of the chassis 10 and is movable between an upper limit position H1 and a lower limit position H2. The motorized chuck stage 30 is disposed in the chassis 10 and adapted to support a wafer W, and the motorized chuck stage 30 is moved upwardly and downwardly along a Z-axis direction shown in the figure in response to a movement of the control rod 20. The probe platform 40 is fixed on the chassis 10 and disposed above the motorized chuck stage 30, and the probe 50 is disposed on the probe platform 40. The image-capturing module 70 is disposed on the chassis 10 and faces the motorized chuck stage 30 to capture the image of the wafer W upon the wafer W is being probed. Therefore, the operator can observe the distance of the tip of the probe 50 with respect to the soldering pad P of the device under test of the wafer W (for the sake of convenience, the size of the soldering pad P in the figures is enlarged). When the position of the control rod 20 is changed, the sensor 202 generates a control signal, and the controller 80 controls the motorized chuck stage 30 and the image-capturing module 70 to be moved along the Z-axis direction according to the control signal.

Specifically, in this embodiment, the wafer probing device 100 comprises a first driving unit 91 and a second driving unit 92. The first driving unit 91 is connected to the motorized chuck stage 30, and the second driving unit 92 is connected to the image-capturing module 70. Moreover, the controller 80 respectively controls the first driving unit 91 to drive the motorized chuck stage 30 to be moved along the Z-axis direction and the second driving unit 92 to drive the image-capturing module 70 to be moved along the Z-axis direction according to the control signal generated by the sensor 202.

As shown in FIG. 1 and FIG. 2, in some embodiments, the image-capturing module 70 further comprises an objective lens module 90 connected to a micro motor (not shown), and the micro motor is signally connected to the controller 80. When the motorized chuck stage 30 is moved, the micro motor drives the objective lens module 90 of the image-capturing module 70 to be moved along the Z-axis direction according to a control command of the controller 80, so that the image-capturing module 70 is kept focusing on the wafer W. The controller 80 generates the control command according to the control signal generated by the sensor 202, and the sensor 202 generates the control signal according to the movement of the control rod 20. Furthermore, in some embodiments, the objective lens module 90 of the image-capturing module 70 is driven by the micro motor corresponding to the movement of the motorized chuck stage 30, so that the image-capturing module 70 is always kept focusing on the wafer on the motorized chuck stage 30 along the Z-axis direction.

In some other embodiments, the objective lens module 90 is not the internal component of the image-capturing module 70; instead, the objective lens module 90 is disposed between the image-capturing module 70 and the motorized chuck stage 30 and is connected to a micro motor (not shown), and the micro motor is signally connected to the controller 80. When the motorized chuck stage 30 is moved, the micro motor drives the objective lens module 90 to zoom or to be moved along the Z-axis direction according to the control command of the controller 80, so that the image-capturing module 70 can obtain a clear image of the wafer W. The controller 80 generates the control command according to the control signal generated by the sensor 202, and the sensor 202 generates the control signal according to the movement of the control rod 20. Moreover, in some embodiments, the objective lens module 90 is driven by the micro motor and is zoomed or moved along the Z-axis direction corresponding to the movement of the motorized chuck stage 30, so that when the motorized chuck stage 30 is moved, the image-capturing module 70 can always capture the image of the wafer W on the motorized chuck stage 30 clearly.

As shown in FIG. 1 and FIG. 2, the control rod 20 is disposed in a slide groove 21 extending along the Z-axis direction, two ends of the slide groove 21 are respectively the upper limit position H1 and the lower limit position H2, and the length of the slide groove 21 along the Z-axis direction is defined as the displacement interval. Under a preset state, when the control rod 20 is at the upper limit position H1, the motorized chuck stage 30 is correspondingly at a first bottom position BP1; on the other hand, when the control rod 20 is at the lower limit position H2, the motorized chuck stage 30 is correspondingly at a first top position TP1.

According to one or some embodiments of the instant disclosure, the motorized chuck stage controlling method can redefine the maximum available height to which the motorized chuck stage 30 can be moved upwardly in response to the movement of the control rod 20, thereby eliminating the risk of the "probe-colliding issue". The following will illustrate in detail according to some embodiments of the instant disclosure with the aid of accompanying drawings.

Figure 4:
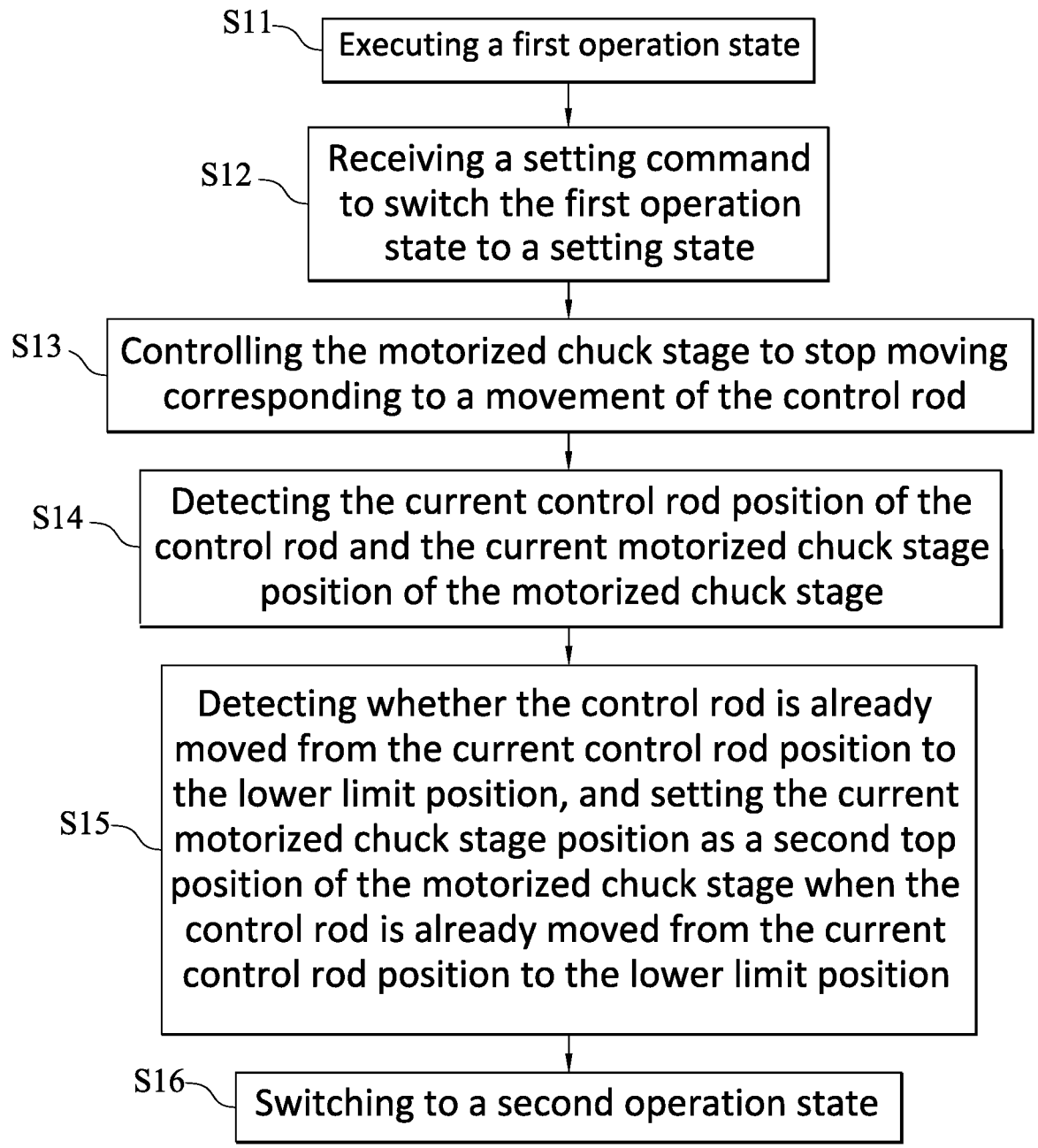
FIG. 4 illustrates a flowchart of a motorized chuck stage controlling method according to a first embodiment of the instant disclosure.
Figure 5:
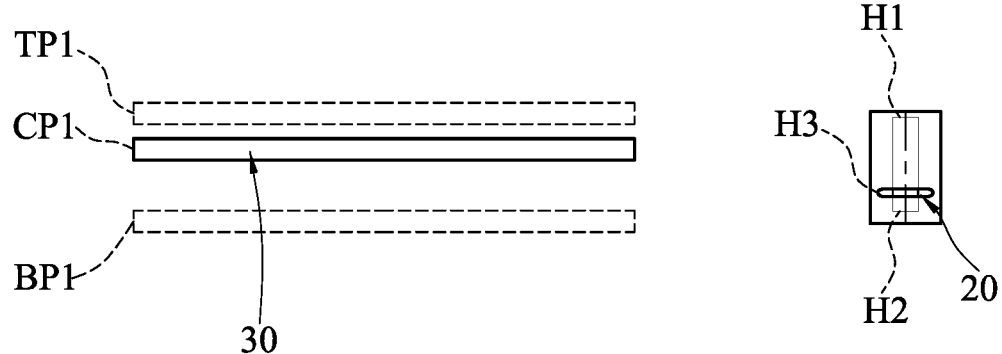
FIG. 5 illustrates a schematic view (1) of a setting state of the motorized chuck stage controlling method according to the first embodiment of the instant disclosure.
Figure 6:
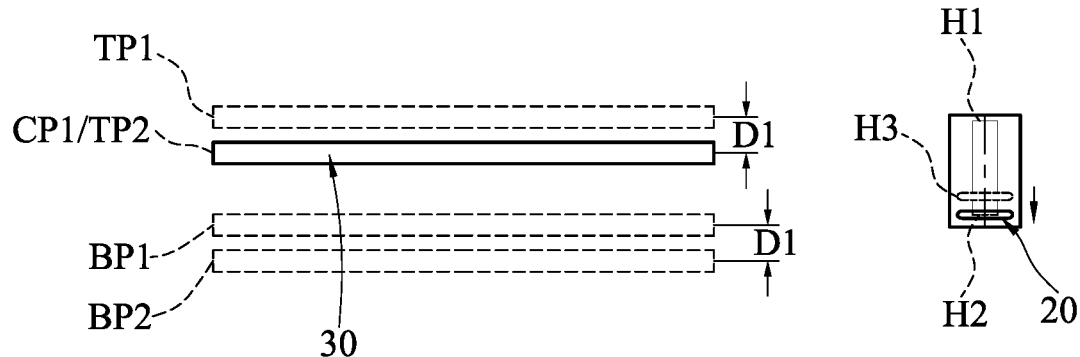
FIG. 6 illustrates a schematic view (2) of the setting state of the motorized chuck stage controlling method according to the first embodiment of the instant disclosure.

Please refer to FIG. 4 to FIG. 6. FIG. 4 to FIG. 6 respectively illustrate a flowchart of a motorized chuck stage controlling method, a schematic view (1) of a setting state of the motorized chuck stage controlling method, and a schematic view (2) of the setting state of the motorized chuck stage controlling method according to a first embodiment of the instant disclosure. As mentioned above, in the preset state (hereinafter, referred to as "a first operation state", when the control rod 20 is at the lower limit position H2, the controller 80 controls the motorized chuck stage 30 to be at the first top position TP1; on the other hand, when the control rod 20 is at the upper limit position H1, the controller 80 controls the motorized chuck stage 30 to be at the first bottom position BP1; when the control rod 20 is moved between the lower limit position H2 and the upper limit position H1, the controller 80 controls the first driving unit 91 to drive the motorized chuck stage 30 to be moved between the first top position TP1 and the first bottom position BP1 correspondingly (the step S11).

Please refer to FIG. 5 again. In FIG. 5, the control rod 20 is moved downwardly from the upper limit position H1 and stopped at a position H3 (hereinafter, referred to as the current control rod position H3), and the motorized chuck stage 30 is correspondingly moved upwardly from the first bottom position BP1 to a position CP1 (hereinafter, referred to as the current motorized chuck stage position CP1). If the operator wishes that the motorized chuck stage 30 is not moved to exceed the current motorized chuck stage position CP1 under any circumstances in the subsequent operations, the operator can execute a setting operation. The setting operation may be pressing a certain physical button on the wafer probing device 100 or clicking a setting button of a graphical user interface displayed on the display 60 so as to generate a setting command. Then, the operation mode of the wafer probing device 100 is switched from the first operation state to a "setting state" (the step S12). The clicking action may be implemented by using a cursor tool such as a mouse, a keyboard or the like; when the display 60 is a touch display, the clicking action may be implemented by using the finger of the operator or a stylus tool. In this embodiment, the current motorized chuck stage position CP1 is defined by the operator; in general, the current motorized chuck stage position CP1 is defined as the position of the motorized chuck stage 30 at which the soldering pad P of the wafer W is going to contact the tip of the probe 50 or the position of the motorized chuck stage 30 at which the soldering pad P of the wafer W slightly contacts the tip of the probe 50.

When the wafer probing device 100 is switched from the first operation state to the setting state, the controller 80 immediately controls the motorized chuck stage 30 to stop moving in response to the movement of the control rod 20 (the step S13). In other words, in this embodiment, after the wafer probing device 100 is switched from the first operation state to the setting state, when the control rod 20 is moved, the controller 80 does not control the motorized chuck stage 30 to be moved. Then, the controller 80 detects the current control rod position H3 of the control rod 20 and the current motorized chuck stage position CP1 of the motorized chuck stage 30 (the step S14). Next, the display 60 can optionally display a notification message to notify the operator to move the control rod 20 from the current control rod position H3 to the lower limit position H2.

Please refer to FIG. 6. Under the setting state, the controller 80 continuously detects whether the control rod 20 is already moved downwardly from the current control rod position H3 to the low limit position H2. When the controller 80 detects that the control rod 20 is already moved from the current control rod position H3 to the lower limit position H2, the controller 80 sets the current motorized chuck stage position CP1 as a second top position (TP2) of the motorized chuck stage 30 (the step S15). It is important to highlight that, in this embodiment, during the process that the control rod 20 is moved from the current control rod position H3 to the lower limit position H2, the motorized chuck stage 30 is always retained at the current motorized chuck stage position CP1. After the current motorized chuck stage position CP1 is set as the second top position TP2 of the motorized chuck stage 30, the operation mode of the wafer probing device 100 is switched from the setting state to "a second operation state" (the step S16).

Please refer to FIG. 6 again. In some embodiment, after the controller 80 sets the current motorized chuck stage position CP1 as the second top position TP2 of the motorized chuck stage 30, when the control rod 20 is at the upper limit position H1, the lowest position to which the motorized chuck stage 30 can be moved in response to the operation of the control rod 20 is changed from the first bottom position BP1 to a second bottom position BP2, and a distance between the first top position TP1 and the first bottom position BP1 is equal to a distance between the second top position TP2 and the second bottom position BP2. In other words, in this embodiment, under the second operation state, the maximum available displacement to which the motorized chuck stage 30 can be moved in response to the movement of the control rod 20 is not changed. Therefore, no matter what position the control rod 20 is at, the motorized chuck stage 30 is not moved upwardly to exceed the second top position TP2 (that is, the current motorized chuck stage position CP1) correspondingly, thereby preventing the "probe-colliding issue" (preventing the probe 50 and wafer W from colliding each other) in the subsequent operations.

Figure 11A:
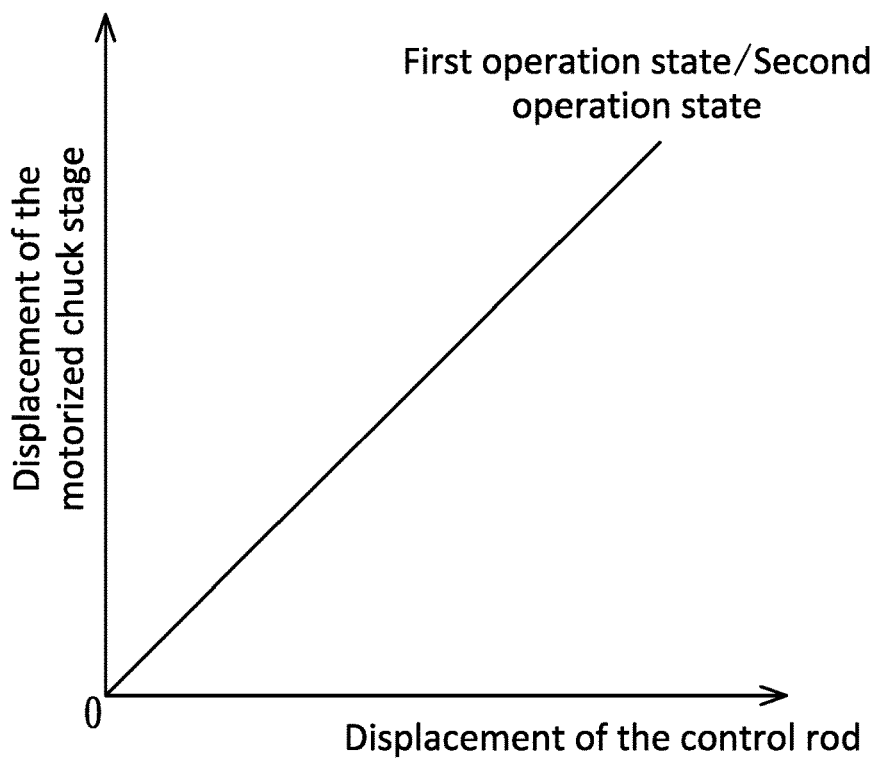
FIG. 11A illustrates a schematic graph (1) showing a linear relationship between the displacement of the control rod and the displacement of the motorized chuck stage in the motorized chuck stage controlling method according to some exemplary embodiments of the instant disclosure.
Figure 12A:
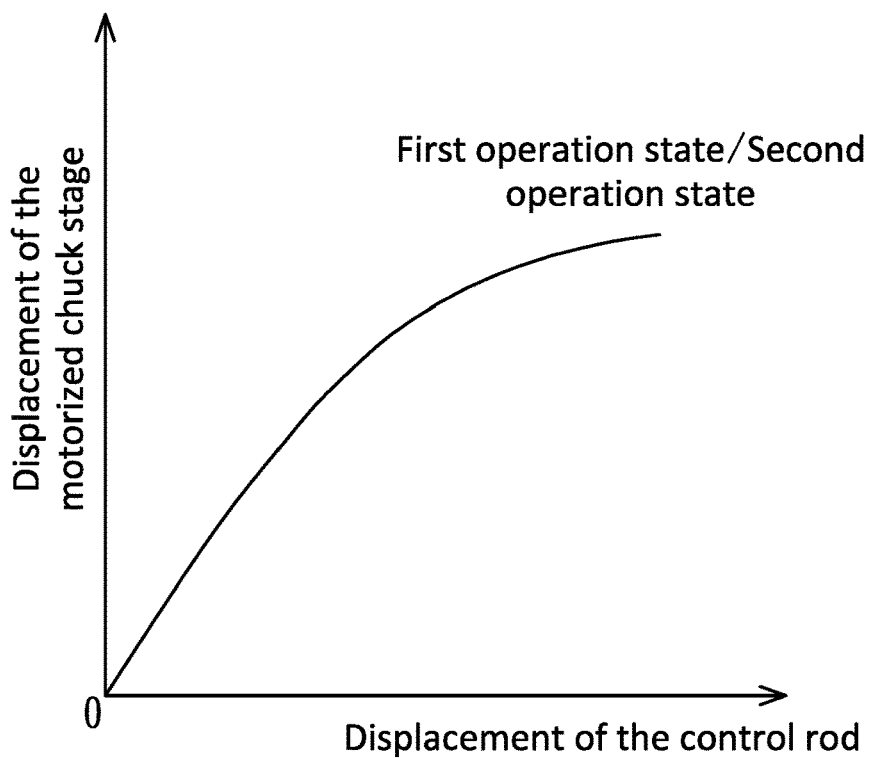
FIG. 12A illustrates a schematic graph (1) showing a nonlinear relationship between the displacement of the control rod and the displacement of the motorized chuck stage in the motorized chuck stage controlling method according to some exemplary embodiments of the instant disclosure.

In some embodiments, the displacement of the motorized chuck stage 30 with respect to the displacement of the control rod 20 may have a linear relationship as shown in FIG. 11A or a nonlinear relationship as shown in FIG. 12A. Moreover, no matter under the first operation state or the second operation state, the relative relationship between the displacement of the motorized chuck state 30 and the displacement of the control rod 20 is remained unchanged.

Figure 11B:
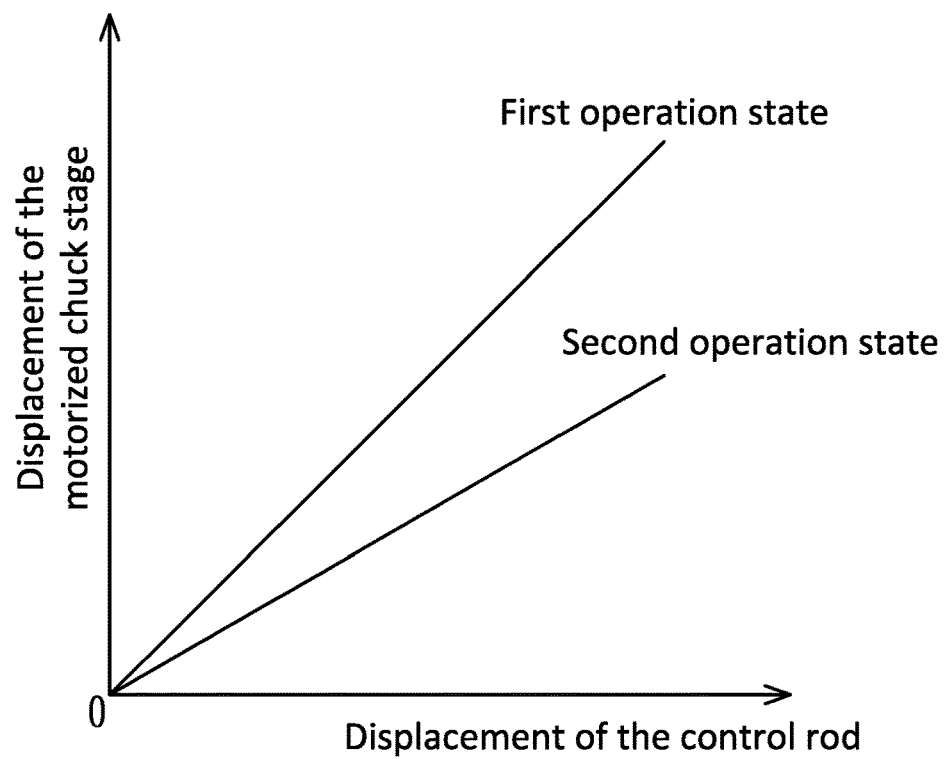
FIG. 11B illustrates a schematic graph (2) showing a linear relationship between the displacement of the control rod and the displacement of the motorized chuck stage in the motorized chuck stage controlling method according to some exemplary embodiments of the instant disclosure.
Figure 12B:
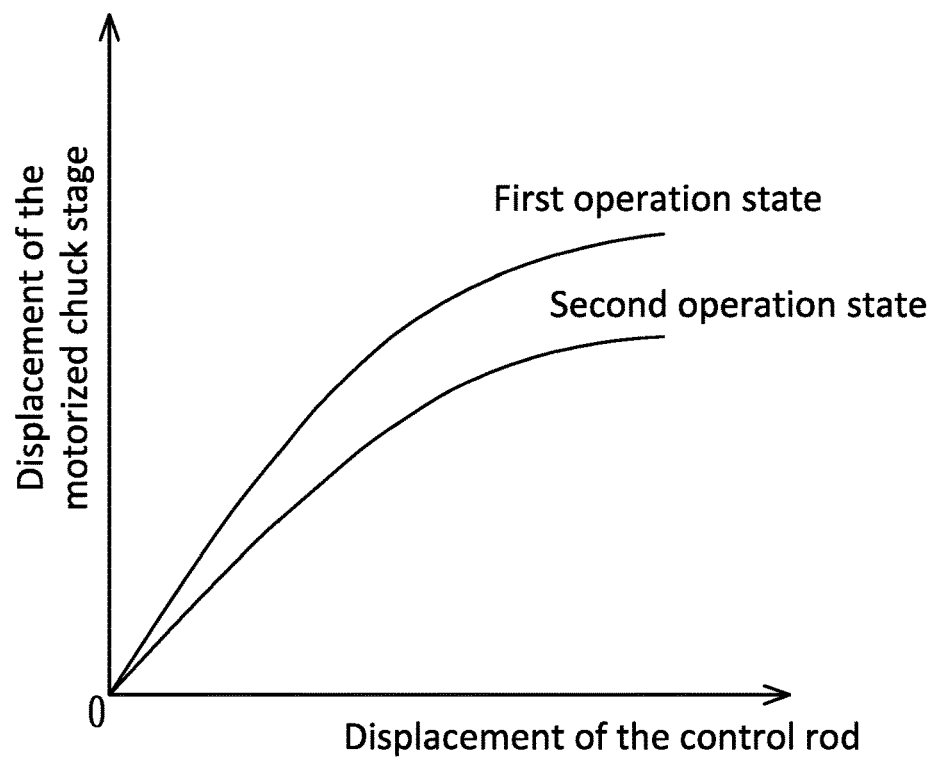
FIG. 12B illustrates a schematic graph (2) showing a nonlinear relationship between the displacement of the control rod and the displacement of the motorized chuck stage in the motorized chuck stage controlling method according to some exemplary embodiments of the instant disclosure.

In some other embodiments, after the controller 80 switches the wafer probing device 100 to the second operation state, the relative relationship between the displacement of the motorized chuck stage 30 and the displacement of the control rod 20 is also changed accordingly. For example, under the second operation state, when the control rod 20 is at the lower limit position H2, the highest position to which the motorized chuck stage 30 can be moved in response to the control rod 20 is shifted downwardly from the first top position TP1 to the second top position TP2; on the other hand, when the control rod 20 is at the upper limit position H1, the lowest position to which the motorized chuck stage 30 can be moved in response to the control rod 20 is remain the first bottom position BP1. In other words, in this embodiment, as compared with the first operation state, under the second operation state, the maximum displacement of the motorized chuck stage 30 in response to the control rod 20 is reduced, and the reduced distance is an offset distance D1 between the first top position TP1 and the second top position TP2. Under this configuration, the relative relationship between the displacement of the motorized chuck stage 30 and the displacement of the control rod 20 under the first operation state is different from that under the second operation state, as shown in FIG. 11B and FIG. 12B.

Figure 7:
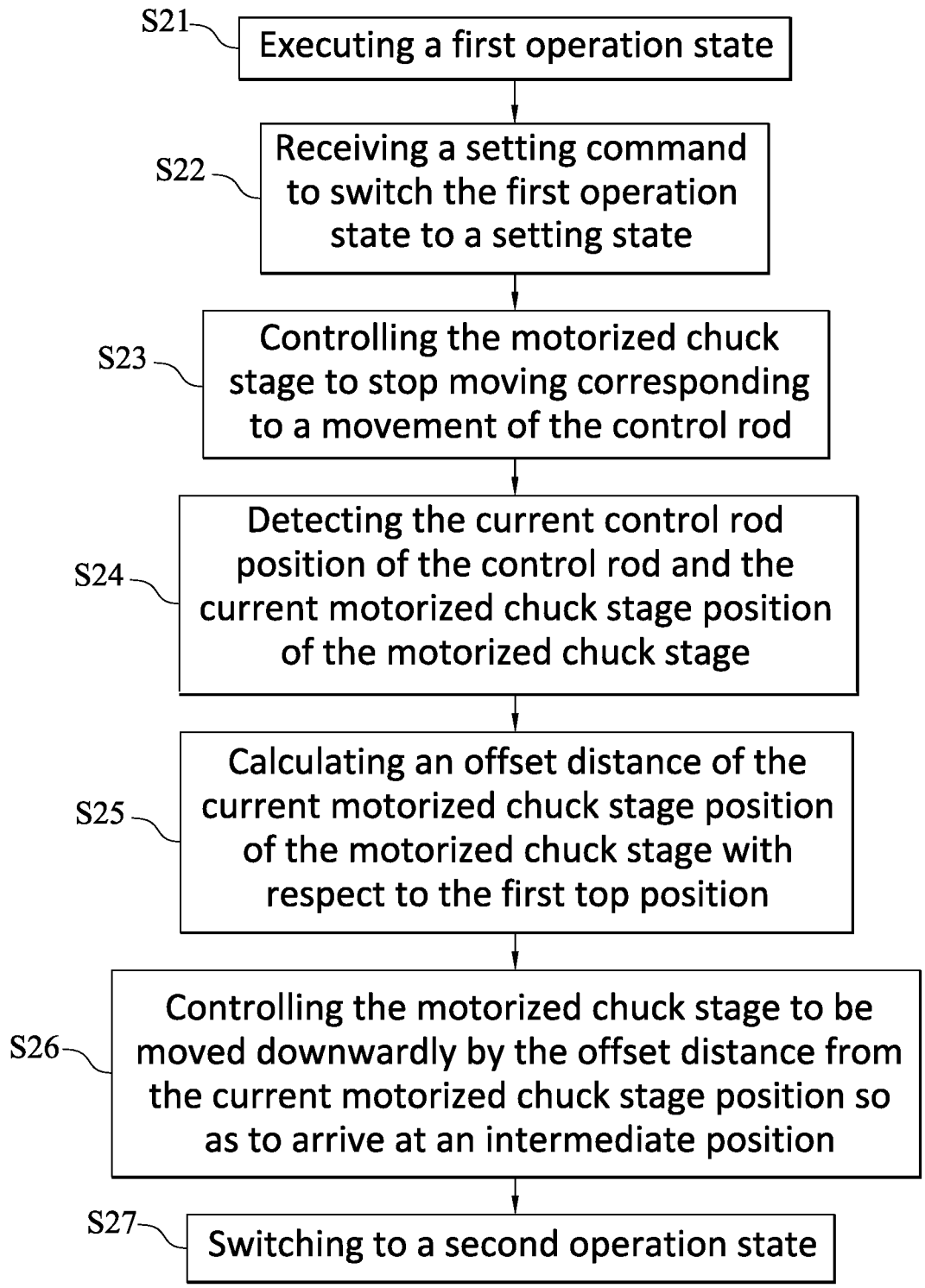
FIG. 7 illustrates a flowchart of a motorized chuck stage controlling method according to a second embodiment of the instant disclosure.
Figure 8:
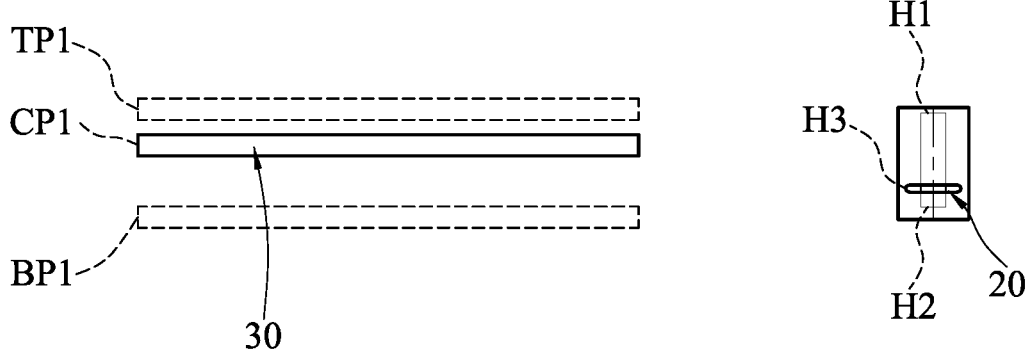
FIG. 8 illustrates a schematic view (1) of a setting state of the motorized chuck stage controlling method according to the second embodiment of the instant disclosure.
Figure 9A:
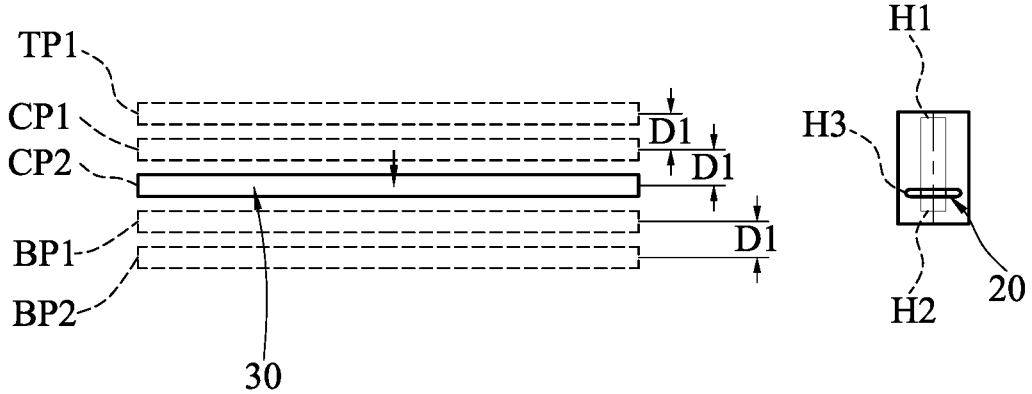
FIG. 9A illustrates a schematic view (2) of the setting state of the motorized chuck stage controlling method according to the second embodiment of the instant disclosure.
Figure 9B:
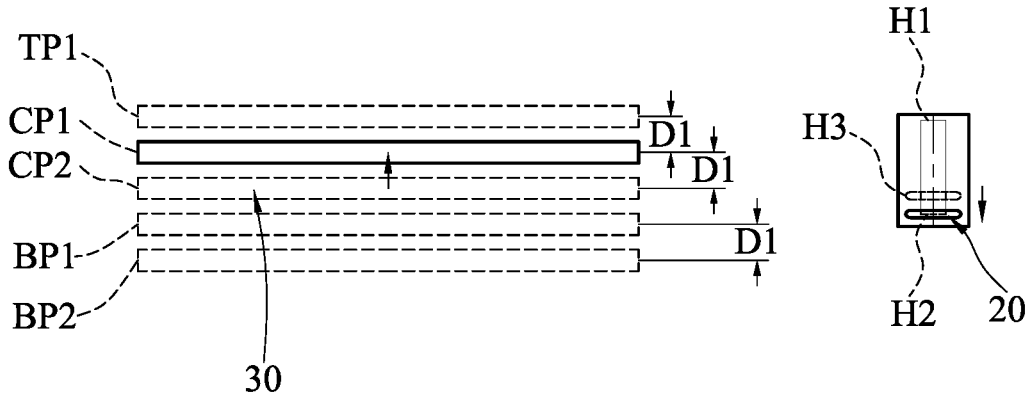
FIG. 9B illustrates a schematic view (3) of the setting state of the motorized chuck stage controlling method according to the second embodiment of the instant disclosure.

Please refer to FIG. 7, FIG. 8, FIG. 9A, and FIG. 9B. FIG. 7 illustrates a flowchart of a motorized chuck stage controlling method according to a second embodiment of the instant disclosure. FIG. 8, FIG. 9A, and FIG. 9B respectively illustrate a schematic view (1), a schematic view (2), and a schematic view (3) of a setting state of the motorized chuck stage controlling method according to the second embodiment of the instant disclosure. In this embodiment, under the first operation state, when the control rod is 20 is at the lower limit position H2, the controller 80 controls the motorized chuck stage 30 to be at the first top position TP1; when the control rod 20 is at the upper limit position H1, the controller 80 controls the motorized chuck stage 30 to be at the first bottom position BP1; when the control rod 20 is moved between the lower limit position H2 and the upper limit position H1, the controller 80 controls the first driving unit 91 to drive the motorized chuck stage 30 to be moved between the first top position TP1 and the first bottom position TP2 correspondingly (the step S21).

Please refer to FIG. 8. In FIG. 8, the control rod 20 is moved downwardly from the upper limit position H1 and stopped at the current control rod position H3, and the motorized chuck stage 30 is correspondingly moved upwardly from the first bottom position TP1 to the current motorized chuck stage position CP1. If the operator wishes that the motorized chuck stage 30 is not moved to exceed the current motorized chuck stage position CP1 under any circumstances in the subsequent operations, the operator can execute a setting operation. The setting operation may be pressing a physical button on the wafer probing device 100 or clicking a setting button of a graphical user interface displayed on the display 60 so as to generate a setting command. When the controller 80 receives the setting command, the controller 80 switches the operation mode of the wafer probing device 100 from the first operation state to a "setting state" (the step S22). The clicking action may be implemented by using a cursor tool such as a mouse, a keyboard or the like; when the display 60 is a touch display, the clicking action may be implemented by using the finger of the operator or a stylus tool.

When the controller 80 switches the wafer probing device 100 to the setting state, the controller 80 immediately controls the motorized chuck stage 30 to stop moving in response to the movement of the control rod 20 (the step S23). Then, the controller 80 detects the current control rod position H3 of the control rod 20 and the current motorized chuck stage position CP1 of the motorized chuck stage 30 (the step S24), and the controller 80 calculates an offset distance D1 between the current motorized chuck stage position CP1 and the first top position TP1 of the motorized chuck stage 30 (the step S25).

Next, as shown in FIG. 9A, the controller 80 controls the motorized chuck stage 30 to be moved downwardly by the offset distance D1 from the current motorized chuck stage position CP1 so as to arrive at an intermediate position CP2 (the step S26). During the process that the motorized chuck stage 30 is moved downwardly from the current motorized chuck stage position CP1 to the intermediate position CP2, the display 60 can display a notification message to notify the operator that the motorized chuck stage 30 is moving. It is important to highlight that, in this embodiment, during the process that the motorized chuck stage 30 is moved downwardly from the current motorized chuck stage position CP1 to the intermediate position CP2, the control rod 20 is always retained at the current control rod position H3. After the motorized chuck stage 30 is arrived at the intermediate position CP2, the operation mode of the wafer probing device 100 is switched from the setting state to "a second operation state" (the step S27).

Please refer to FIG. 9B, under the second operation state, when the control rod 20 is moved downwardly from the current control rod position H3 to the lower limit position H2, the controller 80 controls the first driving unit 91 to drive the motorized chuck stage 30 to be moved upwardly from the intermediate position CP2 to the current motorized chuck stage position CP1 correspondingly. When the control rod 20 is moved upwardly from the lower limit position H2 to the upper limit position H1, the controller 80 controls the first driving unit 91 to drive the motorized chuck stage 30 to be moved downwardly from the current motorized chuck stage 30 to a second bottom position BP2 correspondingly. The second bottom position BP2 is lower than the first bottom position BP1, and the second bottom position BP2 is spaced from the first bottom position BP1 by the offset distance D1. In other words, the overall displacement range of the motorized chuck stage 30 in response to the control rod 20 is reduced by the offset distance D1 along the Z-axis direction. Therefore, no matter what position of the control rod 20 is at, the motorized chuck stage 30 is not moved to exceed the current motorized chuck stage position CP1 correspondingly, thereby preventing the "probe-colliding issue" in the subsequent operations.

In some embodiments, the displacement of the motorized chuck stage 30 with respect to the displacement of the control rod 20 may have a linear relationship as shown in FIG. 11A or a nonlinear relationship as shown in FIG. 12A. Moreover, no matter under the first operation state or the second operation state, the relative relationship between the displacement of the motorized chuck state 30 and the displacement of the control rod 20 is remained unchanged.

In some other embodiments, after the controller 80 switches the wafer probing device 100 to the second operation state, the relative relationship between the displacement of the motorized chuck stage 30 and the displacement of the control rod 20 is also changed accordingly. For example, under the second operation state, when the control rod 20 is at the lower limit position H2, the highest position to which the motorized chuck stage 30 can be moved in response to the control rod 20 is shifted downwardly from the first top position TP1 to the current motorized chuck stage position CP1; on the other hand, when the control rod 20 is at the upper limit position H1, the lowest position to which the motorized chuck stage 30 can be moved in response to the control rod 20 is remain the first bottom position BP1. In other words, in this embodiment, as compared with the first operation state, under the second operation state, the maximum displacement of the motorized chuck stage 30 in response to the control rod 20 is reduced, and the reduced distance is an offset distance D1 between the first top position TP1 and the current motorized chuck stage position CP1. Under this configuration, the relative relationship between the displacement of the motorized chuck stage 30 and the displacement of the control rod 20 under the first operation state is different from that under the second operation state, as shown in FIG. 11B and FIG. 12B.

In some embodiments, when the control rod 20 is at the lower limit position H2, if the operator presses the certain physical button on the wafer probing device 100 or clicks the setting button of the graphical user interface displayed on the display 60, the controller 80 invalidates (or bypasses) the pressing event or the click event. Therefore, the setting command is not generated, and the wafer probing device 100 is not switched to the setting state.

In some embodiments, when the control rod 20 is at the lower limit position H2, when the operator presses the certain physical button on the wafer probing device 100 or clicks the setting button of the graphical user interface displayed on the display 60 so as to generate the setting command, the controller 80 invalidates (or bypasses) the setting command, so that the wafer probing device 100 is not switched to the setting state.

In some embodiments, when the control rod 20 is at the lower limit position H2, the controller 80 blurs the setting button of the graphical user interface displayed on the display 60, so that the operator can be notified that clicking the setting button does not allow the wafer probing device 100 to enter into the setting state under this configuration.

In some embodiments, when the control rod 20 is at the lower limit position H2, the controller 80 controls the graphical user interface of the display 60 to hide the setting button.

In some embodiments, when the control rod 20 is at the lower limit position H2, if the operator clicks the setting button of the graphical user interface displayed on the display 60, the displays pops up an alert message so as to notify the operator that the water probing device 100 cannot be switched to the setting state under this configuration.

In some embodiments, when the wafer probing device 100 is under the first operation state or the second operation state, when the controller 80 controls the first driving unit 91 to drive the motorized chuck stage 30 to be moved along the Z-axis direction, the controller 80 controls the second driving unit 92 to drive the image-capturing module 70 to along the Z-axis direction according to the displacement of the control rod 20 or the displacement of the motorized chuck stage 30 at the same time, so that the image-capturing module 70 is kept focusing on the wafer W.

In the wafer probing device 100, usually, the weight of the probe platform 40 is greater than the weight of the motorized chuck stage 30. Therefore, as compared with driving the motorized chuck stage 30, driving the probe platform 40 needs a higher power and a stronger mechanism. According to one or some embodiments of the instant disclosure, the moving direction of the control rod 20 is opposite to the moving direction of the motorized chuck stage 30. Hence, owing to the optical illusion, when the operator operates the control rod 20 to be moved from the upper limit position H1 to the lower limit position H2, the operator will feel that he or she is controlling the probe platform 40 to be moved downwardly and will not realize that the motorized chuck stage is moved upwardly in reality.

As shown in FIG. 10A to FIG. 10C, in some embodiments, when the control rod 20 is at the upper limit position H1, the motorized chuck stage 30 is at the lowest position. When the control rod 20 is at the lower limit position H2, the motorized chuck stage 30 is at the highest position. Under the first operation state, the highest position of the motorized chuck stage 30 corresponds to the first top position TP1 as shown in FIG. 6 or FIG. 9B; under the second operation state, the highest position of the motorized chuck stage 30 corresponds to the second top position TP2 as shown in FIG. 6 or the current motorized chuck stage position CP1 as shown in FIG. 9B. Under the first operation state or the second operation state, the highest position at which the motorized chuck stage 30 can be arrived may be regarded as the origin position of the motorized chuck stage 30. When the control rod 20 is moved by the operator, the display 60 continuously displays the distance information 62 of the motorized chuck stage 30. The distance information 62 indicates the distance of the motorized chuck stage 30 with respect to the origin position. The distance information 62 helps the operator realizing the current position of the motorized chuck stage 30, so that the operator can further realize whether the tip of the probe 50 is going to contact the wafer W on the motorized chuck stage 30. In some embodiments, when the control rod 20 is at the lower limit position H2, as shown in FIG. 10C, the display 60 does not display the distance information 62. In other words, in this embodiment, as long as the control rod 20 leaves the lower limit position H2, the display 60 displays the distance information 62. The reason is that, when the control rod 20 is at the lower limit position H2, the motorized chuck stage 30 is already at the highest position (the origin position), and the motorized chuck stage 30 cannot be moved upwardly anymore. As mentioned above, displaying the distance information 62 is to help the operator realizing whether the tip of the probe 50 is going to contact the wafer W on the motorized chuck stage 30. Hence, in this embodiment, when the motorized chuck stage 30 is already at the highest position (the origin position), displaying the distance information 62 cannot provide the operator with any benefits.

In some embodiments, when the control rod 20 is at the lower limit position H2 and the motorized chuck stage 30 is correspondingly at the second top position TP2 as shown in FIG. 6 or the current motorized chuck stage position CP1 as shown in FIG. 9B, the surface of the wafer W is adjacent to the tip of the probe 50, but the surface of the wafer W does not contact the tip of the probe 50. Under this configuration, the operator can perform the operation through the graphical user interface displayed on the display 60, so that the operator can control the motorized chuck stage 30 to be moved upwardly in a precise manner, until the surface of the wafer W contacts the tip of the probe 50.

In some embodiments, the distance between the first top position TP1 and the first bottom position BP1 is in a range between 3 mm and 5 mm.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A motorized chuck stage controlling method adapted to a wafer probing device, wherein the wafer probing device comprises a control rod and a motorized chuck stage, the control rod is movable between an upper limit position and a lower limit position, and the motorized chuck stage is moved along a Z-axis direction in response to a movement of the control rod; the motorized chuck stage controlling method comprises:
   under a first operation state, controlling the motorized chuck stage to be at a first top position when the control rod is at the lower limit position, controlling the motorized chuck stage to be at a first bottom position when the control rod is at the upper limit position, and controlling the motorized chuck stage to be moved between the first top position and the first lower portion correspondingly when the control rod is moved between the lower limit position and the upper limit position;
   receiving a setting command, switching from the first operation state to a setting state according to the setting command, and executing following steps:
      controlling the motorized chuck stage to stop moving in response to a movement of the control rod;
      detecting a current control rod position of the control rod and a current motorized chuck stage position of the motorized chuck stage; and
      detecting whether the control rod is already moved from the current control rod position to the lower limit position, and setting the current motorized chuck stage position as a second top position of the motorized chuck stage when the control rod is already moved from the current control rod position to the lower limit position; and
   switching from the setting state to a second operation state, wherein under the second operation state, the motorized chuck stage is controlled to be at the second top position when the control rod is at the lower limit position
   wherein when the control rod is at the lower limit position, invalidating the setting command after receiving the setting command and before switching from the first operation state to the setting state.

2. The motorized chuck stage controlling method according to claim 1, wherein after the current motorized chuck stage position is set as the second top position, when the control rod is at the upper limit position, the motorized chuck stage is correspondingly at a second bottom position, and a distance between the second top position and the second bottom position is equal to a distance between the first top position and the first bottom position.

3. The motorized chuck stage controlling method according to claim 1, wherein after the current motorized chuck stage position is set as the second top position, when the control rod is at the upper limit position, the motorized chuck stage is correspondingly at the first bottom position.

4. The motorized chuck stage controlling method according to claim 1, further comprising:
   displaying a graphical user interface on a display, wherein the graphical user interface comprises a setting button; and
   generating the setting command according to a click event occurred to the setting button.

5. The motorized chuck stage controlling method according to claim 4, wherein when the control rod is at the lower limit position, blurring the setting button of the graphical user interface.

6. The motorized chuck stage controlling method according to claim 4, wherein when the control rod is at the lower limit position, hiding the setting button of the graphical user interface.

7. The motorized chuck stage controlling method according to claim 4, wherein when the control rod is at the lower limit position, displaying an alert message according to the click event occurred to the setting button.

8. The motorized chuck stage controlling method according to claim 1, wherein the wafer probing device further comprises an image-capturing module, the motorized chuck stage is adapted to support a wafer, and the motorized chuck stage controlling method further comprises:
   controlling the image-capturing module to be kept focusing on the wafer according to a displacement of the control rod or a displacement of the motorized chuck stage during the motorized chuck stage is moving.

9. A motorized chuck stage controlling method adapted to a wafer probing device, wherein the wafer probing device comprises a control rod and a motorized chuck stage, the control rod is movable between an upper limit position and a lower limit position, and the motorized chuck stage is moved along a Z-axis direction in response to a movement of the control rod; the motorized chuck stage controlling method comprises:
   under a first operation state, controlling the motorized chuck stage to be at a first top position when the control rod is at the lower limit position, controlling the motorized chuck stage to be at a first bottom position when the control rod is at the upper limit position, and controlling the motorized chuck stage to be moved between the first top position and the first lower portion correspondingly when the control rod is moved between the lower limit position and the upper limit position;
receiving a setting command, switching from the first operation state to a setting state according to the setting command, and executing following steps:
  controlling the motorized chuck stage to stop moving in response to a movement of the control rod;
  detecting a current control rod position of the control rod and a current motorized chuck stage position of the motorized chuck stage; and
  detecting whether the control rod is already moved from the current control rod position to the lower limit position, and setting the current motorized chuck stage position as a second top position of the motorized chuck stage when the control rod is already moved from the current control rod position to the lower limit position;
switching from the setting state to a second operation state, wherein under the second operation state, the motorized chuck stage is controlled to be at the second top position when the control rod is at the lower limit position;
displaying a graphical user interface on a display, wherein the graphical user interface comprises a setting button; and
generating the setting command according to a click event occurred to the setting button;
wherein when the control rod is at the lower limit position, invalidating the click event occurred to the setting button so as not to generate the setting command.

10. A motorized chuck stage controlling method adapted to a wafer probing device, wherein the wafer probing device comprises a control rod and a motorized chuck stage, the control rod is movable between an upper limit position and a lower limit position, and the motorized chuck stage is moved along a Z-axis direction in response to a movement of the control rod; the motorized chuck stage controlling method comprises:
  under a first operation state, controlling the motorized chuck stage to be at a first top position when the control rod is at the lower limit position, controlling the motorized chuck stage to be at a first bottom position when the control rod is at the upper limit position, and controlling the motorized chuck stage to be moved between the first top position and the first lower portion correspondingly when the control rod is moved between the lower limit position and the upper limit position;
  receiving a setting command, switching from the first operation state to a setting state according to the setting command, and executing following steps:
    controlling the motorized chuck stage to stop moving in response to a movement of the control rod;
    detecting a current control rod position of the control rod and a current motorized chuck stage position of the motorized chuck stage;
    calculating an offset distance of a current motorized chuck stage position of the motorized chuck stage with respect to the first top position; and
    controlling the motorized chuck stage to be moved downwardly by the offset distance from the current motorized chuck stage position so as to arrive at an intermediate position; and
  switching from the setting state to a second operation state, wherein under the second operation state, the motorized chuck stage is controlled to be moved upwardly by the offset distance from the intermediate position correspondingly when the control rod is moved downwardly from the current control rod position to the lower limit position
  wherein when the control rod is at the lower limit position, invalidating the setting command after receiving the setting command and before switching from the first operation state to the setting state.

11. The motorized chuck stage controlling method according to claim 10, wherein under the second operation state, when the control rod is at the upper limit position, the motorized chuck stage is correspondingly at a second bottom position lower than the first bottom position, and a distance between the second bottom position and the first bottom position is equal to the offset distance.

12. The motorized chuck stage controlling method according to claim 10, wherein under the second operation state, when the control rod is at the upper limit position, the motorized chuck stage is correspondingly at the first bottom position.

13. The motorized chuck stage controlling method according to claim 10, further comprising:
  displaying a graphical user interface on a display, wherein the graphical user interface comprises a setting button; and
  generating the setting command according to a click event occurred to the setting button.

14. The motorized chuck stage controlling method according to claim 13, wherein when the control rod is at the lower limit position, invalidating the click event occurred to the setting button so as not to generate the setting command.

15. The motorized chuck stage controlling method according to claim 13, wherein when the control rod is at the lower limit position, blurring the setting button of the graphical user interface.

16. The motorized chuck stage controlling method according to claim 13, wherein when the control rod is at the lower limit position, hiding the setting button of the graphical user interface.

17. The motorized chuck stage controlling method according to claim 13, wherein when the control rod is at the lower limit position, displaying an alert message according to the click event occurred to the setting button.

18. The motorized chuck stage controlling method according to claim 10, wherein the motorized chuck stage is adapted to support a wafer, and the motorized chuck stage controlling method further comprises:
  controlling an image-capturing module to be kept focusing on the wafer according to a displacement of the control rod or a displacement of the motorized chuck stage during the motorized chuck stage is moving.

* * * * *